United States Patent
Yu et al.

(10) Patent No.: US 8,629,388 B2
(45) Date of Patent: Jan. 14, 2014

(54) THREE-DIMENSIONAL IMAGE CAPTURING DEVICE

(75) Inventors: Sheng-Jung Yu, Taipei Hsien (TW); Shih-Chieh Yen, Taipei Hsien (TW); Yen-Chun Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 429 days.

(21) Appl. No.: 12/976,966

(22) Filed: Dec. 22, 2010

(65) Prior Publication Data

US 2011/0315863 A1 Dec. 29, 2011

(30) Foreign Application Priority Data

Jun. 29, 2010 (TW) ................................. 99121129 A

(51) Int. Cl.
*H01L 27/00* (2006.01)

(52) U.S. Cl.
USPC ................... 250/208.1; 250/559.22; 348/135; 348/230.1; 356/601; 382/154; 382/285; 396/324

(58) Field of Classification Search
USPC .............. 250/208.1, 559.22; 348/40, 42, 135, 348/230.1; 356/601; 382/154, 285; 396/324
See application file for complete search history.

(56) References Cited

U.S. PATENT DOCUMENTS

| | | | |
|---|---|---|---|
| 5,191,408 A * | 3/1993 | Takanashi et al. | 348/207.99 |
| 6,643,396 B1 * | 11/2003 | Hendriks et al. | 382/154 |
| 7,148,916 B2 * | 12/2006 | Fujiwara | 348/207.99 |
| 2007/0159640 A1 * | 7/2007 | Berestov | 356/611 |

FOREIGN PATENT DOCUMENTS

JP 2010056865 A * 3/2010

* cited by examiner

*Primary Examiner* — Seung C Sohn
*Assistant Examiner* — Kevin Wyatt
(74) *Attorney, Agent, or Firm* — Altis Law Group, Inc.

(57) ABSTRACT

A 3D image capturing device includes a first lens module, a second lens module, a single sensor, an image sensor; a cross dichroic prism; a first mirror; and a second mirror. The first and second lens module have a first optical axis and a second optical axis, respectively. The second lens module is located juxtaposed with the first lens module. The second optical axis is parallel with the first optical axis. The first and second mirrors are arranged at opposite sides of the cross dichroic prism. The first and second mirrors are configured for reflecting and directing light beams from the first and second lens modules to the cross dichroic prism. The cross dichroic prism is configured to redirect the reflected light beams from the first and second mirrors to the image sensor.

10 Claims, 4 Drawing Sheets

THREE-DIMENSIONAL IMAGE CAPTURING DEVICE

BACKGROUND

1. Technical Field

The present disclosure relates to three-dimensional (3D) image capturing device, and particularly to a 3D image capturing device with a single image sensor.

2. Description of Related Art

Conventionally, a 3D image capturing device obtains a 3D image using two camera modules. Each camera module includes an image sensor. Although effective, the need for separate lens modules and image sensors is costly and the camera is not compact.

What is needed, therefore, is a 3D image capturing device that makes use of only one image sensor.

BRIEF DESCRIPTION OF THE DRAWINGS

Many aspects of the present 3D image capturing device can be better understood with reference to the following drawings. The components in the drawings are not necessarily drawn to scale, the emphasis instead being placed upon clearly illustrating the principles of the present 3D image capturing device. Moreover, in the drawings, like reference numerals designate corresponding parts throughout the views.

DETAILED DESCRIPTION

Figure 1:
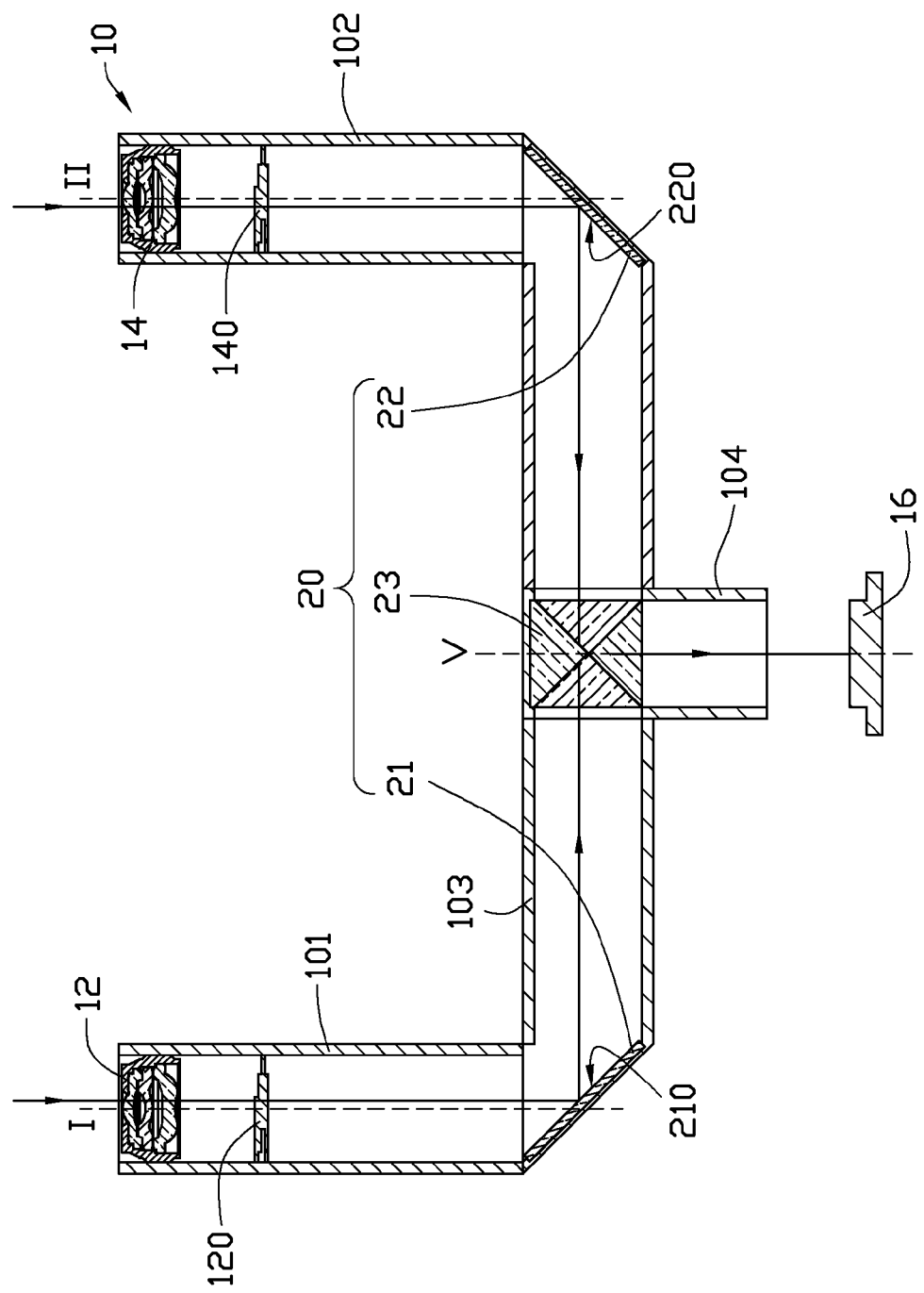
FIG. 1 is a cross sectional view of a 3D image capturing device in accordance with a first exemplary embodiment.

Referring to the FIG. 1, a 3D image capturing device 10 includes a first lens module 12, a second lens module 14, an image sensor 16, and an optical element group 20. The first lens module 12 has a first optical axis I. The second lens module 14 has a second optical axis II. The first optical axis I is parallel to the second optical axis II. The second lens module 14 is juxtaposed with the first lens module 12. The first lens module 12 is spaced from the second lens module 14 by a predetermined distance, for example, 65 mm. In the present embodiment, the first lens module 12 and the second lens module 14 are arranged similar to two eyes of humans, i.e., they are located at positions of a same height and have a same object distance from a same object. The two lens modules thus can both be focused on the same object and capture two images of the object from different points that are not on a line with the object.

The image sensor 16 is configured for receiving light beams from the first and second lens module 12, 14 at the same time, and then converting the light into electronic signals. The image sensor 16 may be a CCD sensor or a CMOS sensor.

The optical element group 20 is configured for leading the incident light of the first and second lens module 12, 14 into the image sensor 16 by reflection or refraction. For example, the optical element group 12 includes a first mirror 21, a second mirror 22, and a cross dichroic prism 23 (X-cube). The first and second mirrors 21, 22 are arranged at opposite side of the cross dichroic prism 23.

The first mirror 21 is located at the light path of the first lens module 12 to reflect incident light beams through the first lens module 12. The first mirror 21 has a first reflecting surface 210. The second mirror 22 has a second reflecting surface 220. The first mirror 21 rotates counterclockwise with respect to the optical axis I at a predetermined angle. The second mirror 22 is located at the light path of the second lens module 14 to reflect incident light beams through the first lens module 14. The second mirror 22 rotates clockwise with respect to the optical axis II at a predetermined angle. The first reflecting surface 210 faces towards the second reflecting surface 220. In this embodiment, the first and second predetermined angels are both 45 degrees. A direction of a reflection light path of the first lens module 12 is different with that of the second lens module 14. In this embodiment, the two reflection light paths are in an opposite direction to each other.

The cross dichroic prism 23 is a combination of four triangular prisms. The cross dichroic prism 23 is configured to combine normal incidence light beams from multiple directions into one output of light beams. The cross dichroic prism 23 is located in the reflection light paths of the first and second mirror 21, 22, and the reflection light beams are substantial normal incidence light beams of the cross dichroic prism 23.

The cross dichroic prism 23 redirects the reflected light beams to the image sensor 16. The image sensor 16 has a central normal V. The central normal V is parallel to the first optical axis I and the second optical axis II, that is, the first and second optical axes I, II are perpendicular to the image sensor 16. The central normal V is perpendicular to the reflected light paths of the first and second mirror 12, 14. In this embodiment, the first optical axis I and the second optical axis II are symmetrical with respect to the central normal V, and the light path along the first optical axis I is also symmetrical with the light path along the second optical axis II with respect to the central normal V.

To accommodate the first lens module 12, the second lens module 14, and the optical element group 20, the 3D image capturing device 10 includes a first tubular housing 101, a second tubular housing 102, a third tubular housing 103, and a fourth tubular housing 104.

The first and the second tubular housing 101, 102 are parallel to each other. Two ends of the third tubular housing 103 are perpendicularly connected to the one end of first and second tubular housing 101, 102, respectively. The fourth tubular housing 104 is intercommunicated with the third tubular housing 103. The first tubular housing 101 is configured for accommodating the first lens module 12, and the second tubular housing 102 is configured for accommodating the second lens module 14. In detail, the first lens module 12 is disposed at the inlet of the first tubular housing 101. The second lens module 14 is disposed at the inlet of the second tubular housing 102.

The first mirror 21 is disposed at the joint portion of the first tubular housing 101 and the third tubular housing 103. The second mirror 22 is disposed at the joint portion of the second tubular housing 102 and the third tubular housing 103. The cross dichroic prism 23 is located in the midpoint of the tubular housing 103, and between the first and second mirror 21, 22 in this embodiment. The cross dichroic prism 23 is also located inside the fourth tubular housing 104.

The image sensor 16 is in the light path of the output light beams of the cross dichroic prism 23 to receive the output light beams. The image sensor 16 may be located inside or outside the fourth tubular housing 104.

The first lens module 12 also includes a first shutter 120. The second lens module 14 also includes a second shutter 140. The first and second shutter 120, 140 configured to act in a synchronized manner.

Figure 2:
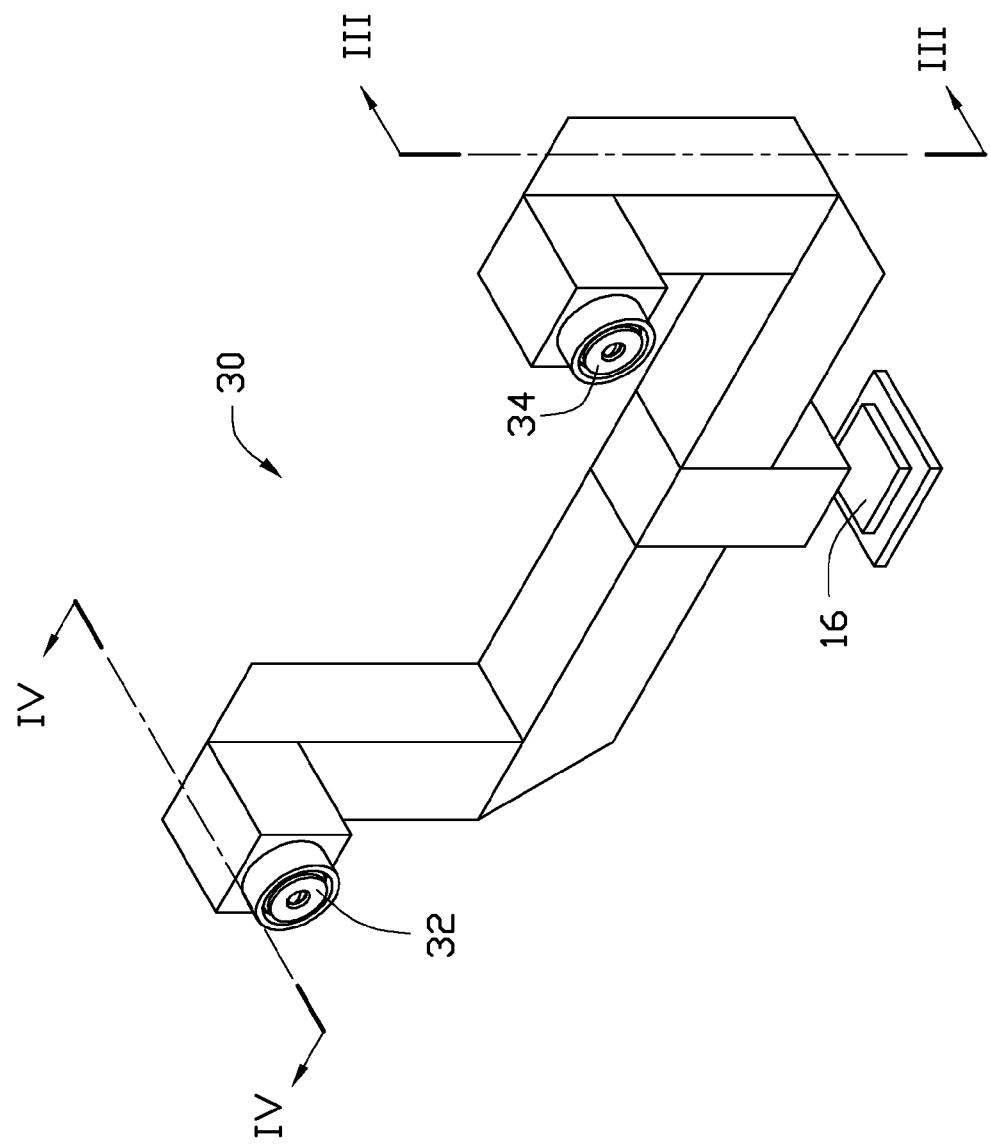
FIG. 2 is a schematic isometric view of a 3D image capturing device in accordance with a second embodiment.
Figure 3:
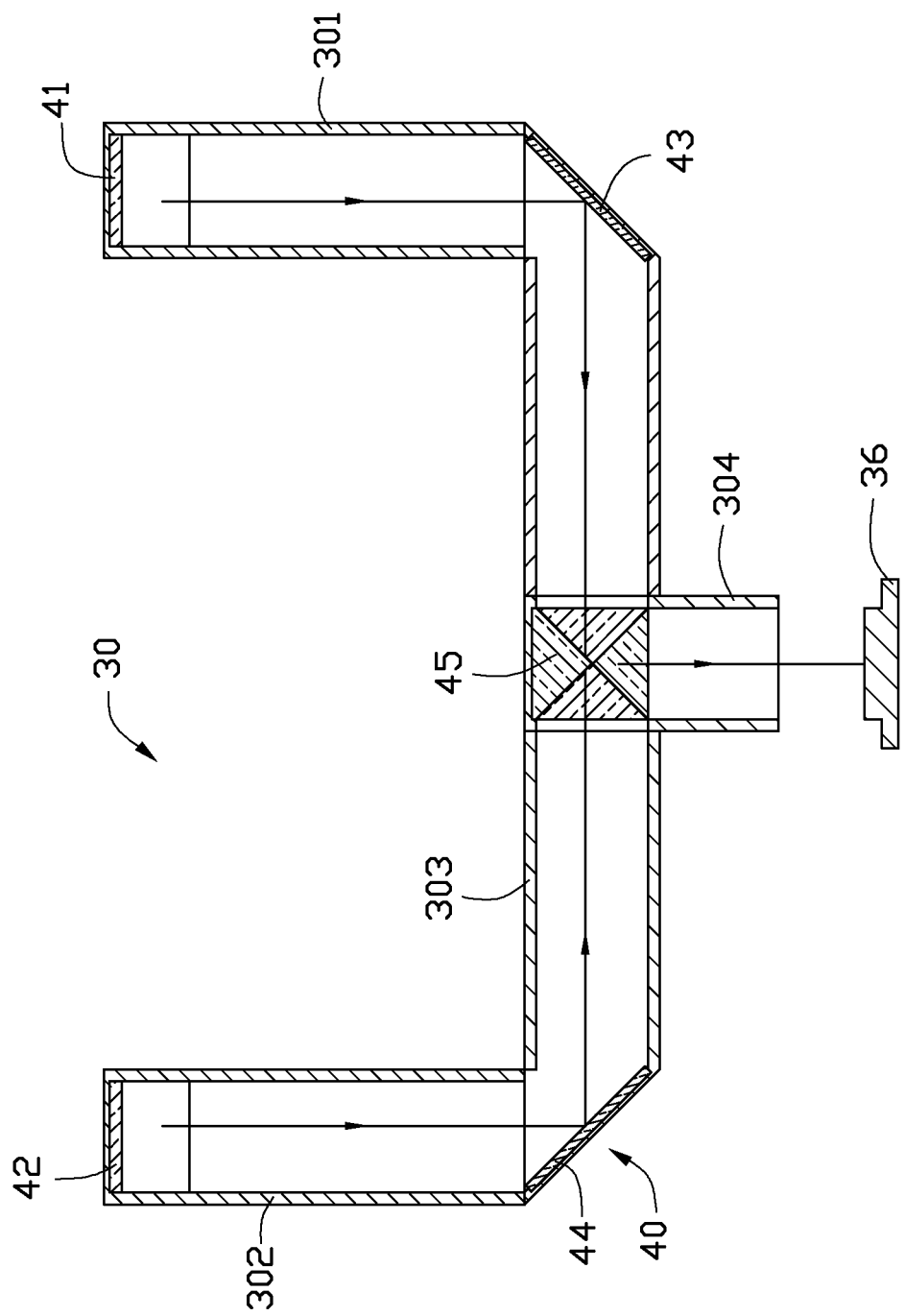
FIG. 3 is a cross-sectional view of the 3D image capturing device shown in FIG. 2, taken along line III-III.
Figure 4:
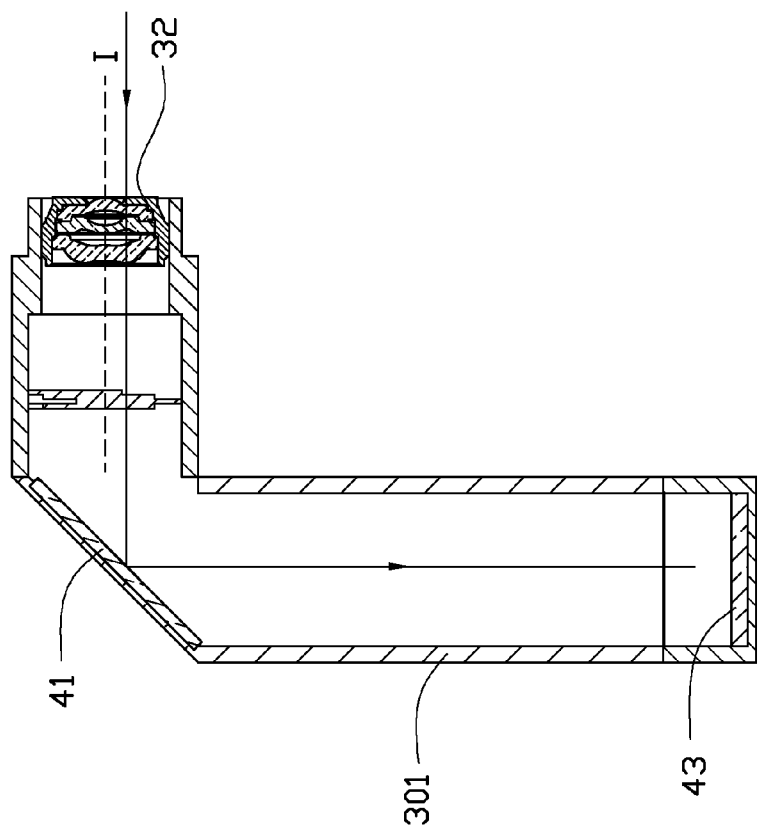
FIG. 4 is a cross-sectional view of the 3D image capturing device shown in FIG. 2, taken along line IV-IV.

FIGS. 2, 3, and 4 show a 3D image capturing device 30 of a second embodiment. The 3D image capturing device 30 includes a first lens module 32, a second lens module 34, an image sensor 36, and an optical element group 40. The first and second optical axes are parallel with the image sensor 36.

The optical element group 40 includes a first lens module mirror 41, a second lens module mirror 42, a first mirror 43, a second mirror 44, and a cross dichroic prism 45. The first lens module mirror 41 is located obliquely oriented relative to the first optical axis I and configured for reflecting and directing light beams from an object side to the first mirror 43. The second lens module mirror 42 is located obliquely oriented relative to the second optical axis II and configured for reflecting and directing light beams from the object side to the second mirror 44. The second mirror 44 is located in the reflection light path of the second lens module mirror 42. The cross dichroic prism 45 is located between the first mirror 43 and the second mirror 44. The first lens module mirror 41 and the second lens module mirror 42 are in a common plane. In other embodiment, if the 3D image capturing device is not a symmetrical structure, the first lens module mirror 41 and the second lens module mirror 42 are not in a common plane but parallel to each other.

The main difference between the 3D image capturing devices 30 and 10 is that the 3D image capturing device 30 has two more lens module mirrors 41, 42 so that the incident light beams are reflected three times before being received by the image sensor 36 in applications where further conditioning of the light beams is desired. For example, the light beams incident through the first lens module 32 are reflected by the first lens module mirror 41, the first mirror 43, and then the cross dichroic prism 45 sequentially. The light beams incident through the second lens module 34 are reflected by the second lens module mirror 42, the second mirror 44, and then the cross dichroic prism 45 sequentially.

To accommodate the first lens module 32, the second lens module 34, and the optical element group 40, the 3D image capturing device 30 also includes a first tubular housing 301, a second tubular housing 302, a third tubular housing 303, and a fourth tubular housing 304. Referring to FIGS. 3 and 4, the first tubular housing 301 has a rectangular or circular corner where the first mirror 41 is disposed. The third mirror 43 is disposed at the joint portion of the first tubular housing 301 and the third tubular housing 303. The joint portion is also a rectangular or circular corner. The second tubular housing 302 has the same structure as the first tubular housing 301. Two ends of the third tubular housing 303 are perpendicularly connected to the one end of first and second tubular housing 301, 302, respectively. The fourth tubular housing 304 is perpendicularly interconnected with the third tubular housing 303 substantially at the midpoint of the third tubular housing 303. The cross dichroic prism 45 is disposed at the intersection of third and fourth tubular housings 303, 304.

The 3D image capturing device provided by this disclosure makes use of a cross dichroic prism to combine incident light beams coming from two different directions into one output of light beam, thus, the 3D image capturing device needs a single image sensor disposed in the light path of the output light beams. The cost of the 3D image capturing device is cut down. The 3D image capturing device accepts incident light beams from two different directions reflected or emitted by a same object, thus the output electronic signals can be analyzed and then shown as 3D images by other appropriate apparatus.

It is understood that the above-described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. A 3D image capturing device, comprising:
a first lens module having a first optical axis associated therewith;
a second lens module juxtaposed with the first lens module, the second lens module having a second optical axis associated therewith, the second optical axis being parallel with the first optical axis, and the first and second optical axes being parallel with the image sensor;
an image sensor;
a cross dichroic prism;
a first mirror; and
a second mirror, the first and second mirrors arranged at opposite sides of the cross dichroic prism, the first and second mirrors configured for reflecting and directing light beams from the first and second lens modules to the cross dichroic prism, the cross dichroic prism configured to redirect the reflected light beams from the first and second mirrors to the image sensor, wherein the first lens module comprises a first lens module mirror obliquely oriented relative to the first optical axis and configured for reflecting and directing light beams from an object side to the first mirror; and the second lens module comprises a second lens module mirror obliquely oriented relative to the second optical axis and configured for reflecting and directing light beams from the object side to the second mirror.

2. The 3D image capturing device according to claim 1, wherein the first lens module mirror is parallel with the second lens module mirror.

3. The 3D image capturing device according to claim 1, wherein the first lens module mirror and the second lens module mirror are located on a common plane.

4. The 3D image capturing device according to claim 1, wherein the first mirror is perpendicular to the second mirror.

5. The 3D image capturing device according to claim 1, further comprising a first shutter and a second shutter, the first and second shutters configured to act in a synchronized manner.

6. A 3D image capturing device, comprising:
a first lens module having a first optical axis associated therewith;
a second lens module juxtaposed with the first lens module, the second lens module having a second optical axis associated therewith, the second optical axis being parallel with the first optical axis;
an image sensor;
a cross dichroic prism;
a first mirror; and
a second mirror, the first and second mirrors arranged at opposite sides of the cross dichroic prism, the first and second mirrors configured for reflecting and directing light beams from the first and second lens modules to the cross dichroic prism, the cross dichroic prism configured to redirect the reflected light beams from the first and second mirrors to the image sensor;
a first tubular housing configured to accommodate the first lens module;

a second tubular housing parallel with the first tubular housing and configured to accommodate the second lens module;

a third tubular housing perpendicularly connected with the first and second tubular housing, the first mirror located at a joint portion of the first and third tubular housings, the second mirror located at a joint portion of the second and third tubular housings, the cross dichroic prism located inside the third tubular housing and between the first and second mirrors; and a fourth tubular housing perpendicularly connected with the third tubular housing.

7. The 3D image capturing device according to claim 6, wherein the first mirror is perpendicular to the second mirror.

8. The 3D image capturing device according to the claim 6, wherein the first and second optical axes are perpendicular to the image sensor.

9. The 3D image capturing device according to the claim 6, wherein the first and second optical axes are parallel with the image sensor.

10. The 3D image capturing device according to claim 6, further comprising a first shutter and a second shutter, the first and second shutters configured to act in a synchronized manner.

* * * * *